(12) United States Patent
Jiang

(10) Patent No.: US 12,222,407 B2
(45) Date of Patent: Feb. 11, 2025

(54) DEVICE FOR CHECKING THE WITHSTAND VOLTAGE OF A CABLE TO WHICH A CONNECTOR IS CONNECTED

(71) Applicant: SEWON ELECTRONICS CO., LTD., Pyeongtaek-Si (KR)

(72) Inventor: Pengtao Jiang, Weihai (CN)

(73) Assignee: SEWON ELECTRONICS CO., LTD., Pyeongtaek-si (KR)

( * ) Notice: Subject to any disclaimer, the term of this patent is extended or adjusted under 35 U.S.C. 154(b) by 167 days.

(21) Appl. No.: 18/091,065

(22) Filed: Dec. 29, 2022

(65) Prior Publication Data

US 2023/0213594 A1    Jul. 6, 2023

(30) Foreign Application Priority Data

Dec. 31, 2021    (KR) .......................... 10-2021-0194715

(51) Int. Cl.
*G01R 31/66*    (2020.01)
*G01R 31/52*    (2020.01)

(52) U.S. Cl.
CPC ............. *G01R 31/66* (2020.01); *G01R 31/52* (2020.01)

(58) Field of Classification Search
None
See application file for complete search history.

(56) References Cited

U.S. PATENT DOCUMENTS 4,001,674 A * 1/1977 Schneider .......... G01R 31/1272
324/544
2018/0305614 A1* 10/2018 Tong ....................... C01F 17/36

\* cited by examiner

*Primary Examiner* — Vincent Q Nguyen
(74) *Attorney, Agent, or Firm* — Hauptman Ham, LLP

(57) ABSTRACT

A withstand voltage of a connector-coupled cable is checked by the device equipped with a pair of electrode boxes, and a control block configured to apply a start signal to a test instrument, which outputs a preset high voltage, according to an electrical state detected in each electrode box in which a housing whose a part of a front side is open; a conductive electrode plate mounted on an inner front side of the housing in such a way that it is rotatable around its top end, and a switch unit, mounted inside the housing with a predetermined gap from the electrode plate, to detect whether the electrode plate is rotated due to push on a lower part of the electrode plate are installed, wherein the electrical state is an electrical state between both terminals of the detection unit, and the preset high voltage is applied between both electrode plates.

18 Claims, 10 Drawing Sheets direction of the electrode plate

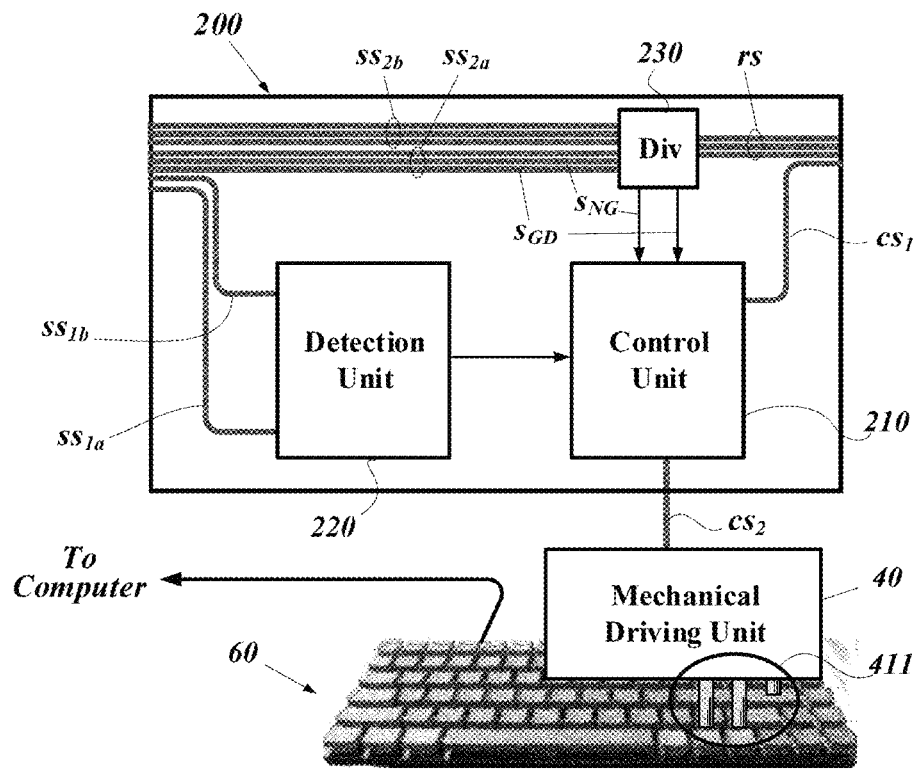

DEVICE FOR CHECKING THE WITHSTAND VOLTAGE OF A CABLE TO WHICH A CONNECTOR IS CONNECTED

CROSS-REFERENCE TO RELATED APPLICATION

This application claims the priority of Korean Application No. 10-2021-0194715, filed on Dec. 31, 2021. The entire disclosure of the above application is incorporated herein by reference.

BACKGROUND OF THE INVENTION

Field of the Invention

The present invention relates to a device for checking the withstand voltage of a cable having a connector coupled to one end thereof.

Description of the Related Art

These days, many kinds of devices and appliances are used in daily life, work, leisure activities or medical practices etc. of people. Most of them perform the intended operations or functions based on electrical signal exchanges among their components. Particularly, a large-sized equipment, for example, a vehicle, a communication device, a medical device or the like connects many kinds of cables to each other among a large number of components to enable electrical communication therebetween.

In many types of cables, a connector, which is a wire connection terminal having a specific shape and structure, is connected at the end of a cable in an electrically connected state. Wires of a cable terminated with such a connector are electrically connected to the components on a board by being engaged with a corresponding connector, which has a male-female coupling shape and structure, provided on the board, etc. on which the components are mounted. Therefore, electrical connections between components requiring signal transceiving with each other are easily made through the connector.

For such easy electrical connection, a work of coupling the connector to a cable should be preceded. In this connector combining work, a defective product, which will probably cause a problem when it is later applied to an actual device, may be produced.

FIG. 1 shows an example of a connector-coupled cable 1 which is generally used a lot. As shown, a cable 1 is composed of a plurality of wire cores (wire strands) made of conductors 4; (i=1,2,3, . . . ), each wrapped with an insulator 3, a shield 5 surrounding the wire cores, and an sheath 2, and a connector 6 is coupled to one end of the cable 1.

In order to couple the connector 6 to one end of the cable 1 as illustrated in FIG. 1, first, it is necessary to cut the sheath 2 and the inner shield 5 near (CP) the end of the cable 1. In this cutting operation, the cut portion of the shield 5 may be pushed into the cut groove of the insulator 3 as the blade of a cutter partially cuts the insulator 3 of a wire strand due to the case where the cutting strength is not properly adjusted or the inner wire strands are in a twisted state, etc.

In such a case, sufficient impedance between the conductors may not be secured due to a short circuit between the shield 5 and the conductor of which insulator is partially cut, or damage to the insulator serving as an insulation. If a cable with the connector combined like that is installed in a device, the signal to be transmitted through the cable may not be transmitted normally, or the electrical circuit of the components may be damaged due to the current flowing into the conductor of the wire core when a surge voltage is applied to that cable.

A withstand voltage of a connector-coupled cable is tested in order to detect in advance such a defect to be caused from the connector combining. The withstand voltage test is to check whether the ground wire 5a made from the shield 5 and the conductor strands 4 of the core wires are sufficiently insulated, with respect to the cable 1 to which the connector 6 is coupled as shown in FIG. 1. Using a test device as illustrated in FIG. 2, the withstand voltage is individually checked for the connector-coupled cables.

The test device shown in FIG. 2 includes a Withstand Voltage Tester (WVT) 10 that outputs a high voltage required for a withstand voltage test, a pair of electrode pads 11a and 11b, and a switch pedal 12. The withstand voltage test using the test device of FIG. 2 proceeds as follows.

A worker holds the ground wire 5a and the conductor strands 4 of the connector-coupled cable 1 with both hands and brings them into contact with the electrode plate 111 of each electrode pad 11a and 11b (p11, p12), respectively. In that state, by stepping on the switch pedal 12 with one foot (p20), a test start signal is applied to the WVT 10.

When the test start signal is applied, the WVT 10 drives the output ports $PO_1$ and $PO_2$ to a preset high voltage for a set driving time. After checking whether current flows between both output ports $PO_1$ and $PO_2$ by detecting the magnitude of current flowing therebetween during the driving time, the WVT displays the checked result on an LED provided on the front side.

When an LED indicating no current is lit, a worker treats the connector-coupled cable 1 as an acceptable product in which insulation between the shield 5 and the conductor strands 4 is satisfied, and when another LED indicating current flowing is lit, he treats it as a defective product with insufficient insulation.

However, the withstand voltage test of a connector-coupled cable using the test device of FIG. 2 has a problem in that it does not provide a sufficiently reliable test result. Since current cannot flow between both electrode plates 111 even if a worker starts the test by stepping on the switch pedal 12 in a state in which one or both of the ground wire 5a and the conductor strands 4 are not contacted to the electrode plate 111, the WVT 10 displays the test result of the cable as normal.

Furthermore, even if the contact state of the ground wire 5a and the conductor strands 4 with the electrode plate 111 is not maintained for a certain period of time required by the withstand voltage test after the test is started by stepping on the switch pedal 12 in that contact state, the WVT 10 also displays the test result of the cable as normal.

In the case of a worker who quickly and repeatedly performs the same test for a large number of cables, a mistake may be made in the test work of: having to step on the switch pedal 12 after confirming the contact of the ground wire and the conductor strands with the electrode plate 111; and maintaining the contact state until the test result display of the WVT 10. Therefore, there may be cables for which the withstand voltage test result is judged to be pass even though the test that does not actually satisfy the test condition is made, as described above.

And, in the test work using the test device of FIG. 2, since a worker must use one foot as well as both hands for the withstand voltage test, fatigue is felt faster than other works using only both hands. When fatigue increases, workability decreases, and the number of cables being normally processed by the test in the wrong state that the test condition is not observed increases.

SUMMARY OF THE INVENTION

An object of the present invention is to provide a device for checking the withstand voltage of a cable that enables a withstand voltage test for a connector-coupled cable to be completed in a state that satisfies the test condition.

Another object of the present invention is to provide a device for checking the withstand voltage of a cable that enables a worker to perform a withstand voltage test for a connector-coupled cable using only both hands.

Another object of the present invention is to provide a device for checking the withstand voltage of a cable that automatically records a history of withstand voltage test for a connector-coupled cable.

Another object of the present invention is to provide a device for checking the withstand voltage of a cable that can prevent intentional slowdown of a worker in a withstand voltage test for a connector-coupled cable.

The scope of the present invention is not necessarily limited to the above explicit statements. Rather, the scope of the present invention covers anything to accomplish effects that could be derived from the specific and illustrative explanations of the present invention below.

A first device for checking withstand voltage of a cable in accordance with an aspect of the present invention, comprises: a pair of electrode boxes; and a control block configured to apply a start signal to a test instrument, which drives output ports thereof with a preset voltage, according to an electrical state detected in each of the pair of electrode boxes. Each of the pair of electrode boxes comprises: a housing configured such that at least a part of a front side thereof is open; a conductive electrode plate mounted on an inner front side of the housing in such a way that it is rotatable around its top end; and a detection unit, mounted inside the housing with a predetermined gap from the electrode plate, configured to detect a state in which the electrode plate is rotated while a lower part of the electrode plate is pushed inward. The electrical state is an electrical state between both terminals of the detection unit, and the electrode plates of the pair of electrode boxes are electrically connected to the output ports respectively.

A second device for checking withstand voltage of a cable in accordance with another aspect of the present invention, comprises a pair of electrode boxes, each of which comprises: a housing configured such that at least a part of a front side thereof is open; a conductive movable plate mounted on an inner front side of the housing in such a way that it is rotatable around its top end; and a static plate fixed to an inner front side of the housing so as to be vertically coplanar with the movable plate by leaving a gap with a lower end of the movable plate. In this second device, electrical disconnection or short circuit between the movable plate and the static plate according to whether a conductive object is inserted into the gap are detected as an electrical state by the control block. The movable plates or the static plates of the pair of electrode boxes are electrically connected to the output ports respectively.

In an embodiment according to the present invention, a lower part of the movable plate and an upper part of the static plate, which are components of the second device, bend into the housing to form a curved surface, respectively.

in accordance with another aspect of the present invention, the second device further comprises a first contact piece fixed to one side of the movable plate in an electrically insulating manner from the movable plate, and a second contact piece provided at a spot, on inner surface of a front support of the housing, that faces the first contact piece. And, signal lines for detecting a contact between the first and the second contact pieces are respectively connected to the both contact pieces, and each of the signal lines is connected to a detecting circuit included in the control block. In the present embodiment, the control block applies a reset signal to the test instrument if non-contact state between the both contact pieces detected from the signal lines is not maintained until a predetermined time elapses from a time of applying the start signal.

In an embodiment according to the present invention, the control block of the second device comprises a detecting circuit configured to apply a voltage to both terminals, which are the movable plate and the static plate respectively, in order to detect the electrical state, and a control unit configured to cut an electrical connection within the detection circuit so that no current flows therein when a signal corresponding to a short circuit between the movable plate and the static plate is detected from the detection circuit.

In an embodiment according to the present invention, the housing of the second device is structured such that height of the static plate from bottom of the housing can be adjusted.

In an embodiment according to the present invention, the control block of the first device applies a reset signal to the test instrument if the electrical state at a time of applying the start signal is not maintained until a predetermined time elapses from the time of applying the start signal.

In an embodiment according to the present invention, at least a part of region on the electrode plate of the first device is configured to have an inclined surface formed according to a shape that is more recessed toward inside of the housing as a part thereof is closer to center.

In an embodiment according to the present invention, an accessory member to face the detection unit when it rotates together with the electrode plate is coupled to the electrode plate of the first device. In the present embodiment, the electrical state between the both terminals of the detection unit is changed by physical contact with the accessory member or by non-contact entrance of the accessory member into a predetermined detection space.

In another embodiment according to the present invention, the electrical state between the both terminals of the detection unit is changed when a force is applied to detection unit by the electrode plate or an accessory member coupled to the electrode plate.

In an embodiment according to the present invention, the control block is configured to be connected to a specific line, through which the test instrument transmits a signal for displaying a test result according to driving the output ports to the preset voltage, and to be able to receive a signal carried on the specific line. In this embodiment, the control block may control lighting of a plurality of light source elements, which are fixedly installed on one surface of the housing, so that they are turned on differentially depending on a signal carried on the specific line. In addition, the device may further comprises a mechanical driving unit, installed above input means of a computing device, capable of individually stroking a plurality of keys provided on the input means. In the device of such a configuration, the control block may apply a driving signal to the mechanical driving unit so that it strokes a different key depending on a signal carried on the specific line.

applies the start signal at a time when the electrical states detected respectively from the pair of electrode boxes become the same.

In an embodiment according to the present invention, the control block may apply a reset signal to the test instrument when a predetermined time elapses from a time of applying the start signal.

In accordance with the present invention described above or at least one embodiment of the present invention to be described in detail below with reference to appended drawings, a device of testing the withstand voltage of a cable allows a worker to proceed with the withstand voltage test for a cable using only both hands. Therefore, the work fatigue of a worker is reduced, the testing time is shortened as well, and thus workability is greatly improved.

In one embodiment of the present invention, the test history for a large number of cables to be checked withstand voltage thereof is automatically recorded in a computing device, so that it is possible to facilitate the management of test works, to improve reliability of test results, and to improve workability through analysis of recorded work data.

In addition, in the embodiments of the present invention, the test result can be obtained only when the test condition is maintained for the time required for the withstand voltage test of a cable, and the withstand voltage test result can be obtained normally only when the conductive part of a cable is used. When these embodiments are applied, the quality of the withstand voltage test for cables is greatly improved. On the other hand, careless test work or slowdown of a worker can be prevented in advance.

BRIEF DESCRIPTION OF THE DRAWINGS

FIG. 6 is a view showing the configuration of a control block according to an embodiment of the present invention, along with a mechanical driving unit and the connection relationship therewith;

FIG. 7 is an example schematically showing a method in which pass/fail information is automatically recorded, as a test history with respect to a list provided for cables to be checked, according to an embodiment of the present invention;

DETAILED DESCRIPTION OF THE INVENTION

Figure 1:
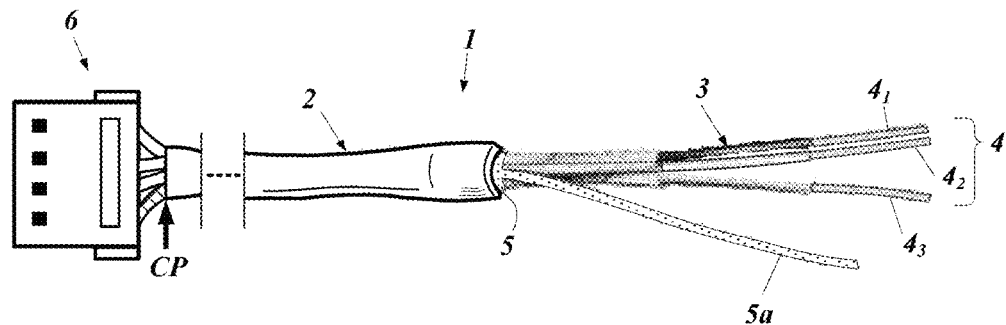
FIG. 1 shows an example of a commonly used cable to which a connector is coupled.
Figure 2:
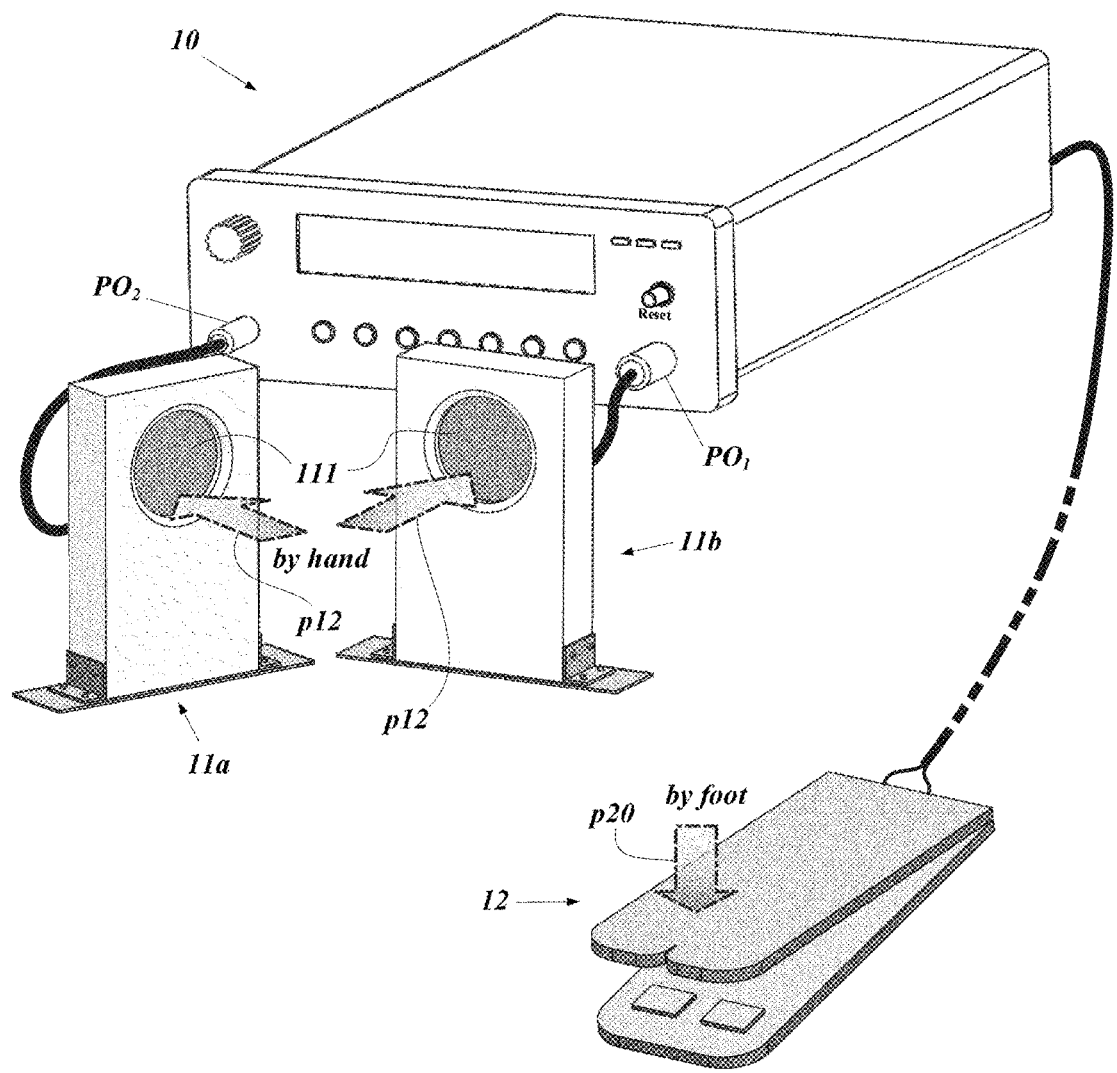
FIG. 2 illustrates a conventional device for testing the withstand voltage of a connector-coupled cable.

In what follows, embodiments of the present invention will be described in detail with reference to appended drawings.

In the following description of the embodiments of the present invention and the accompanying drawings, the same reference numerals or symbols designate the same elements unless otherwise specified. Of course, for convenience of explanation and for the sake of understanding, the same components may be indicated by different reference numbers or symbols if necessary.

Figure 3:
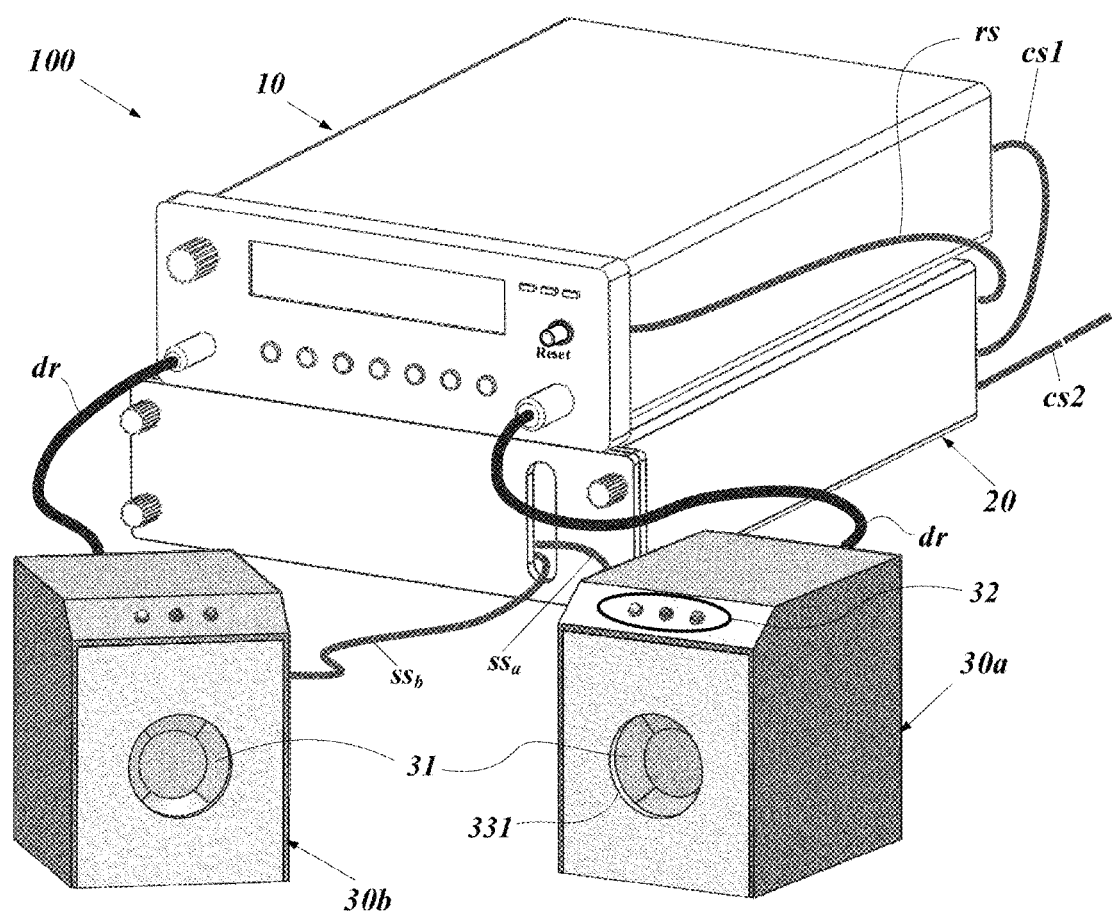
FIG. 3 is a view showing the components of a device for testing the withstand voltage of a connector-coupled cable according to an embodiment of the present invention.

FIG. 3 is a view showing the components of a device 100 for testing the withstand voltage of a connector-coupled cable according to an embodiment of the present invention. The Withstand Voltage Test Device (WVTD) 100 configured according to the present invention includes, as a component thereof, a WVT 10 that outputs a high voltage required for withstand voltage test; a pair of electrode boxes 30a and 30b; and a control block, built in a control box 20, for applying necessary control signals to the WVT 10 depending on the electrical signals detected from the pair of electrode boxes 30a and 30b, respectively.

In an embodiment according to the present invention, the WVTD 100 may be configured to further include a mechanical driving unit not shown in FIG. 3. The mechanical driving unit is configured to apply a physical force to the input means of a computing device according to a control signal transmitted from the control block. This configuration will be described in detail in the corresponding embodiment.

In each of the electrode boxes 30a and 30b: the front side 33 of the housing is opened to a predetermined size; the electrode plate 31 made of a conductive material is installed on the inner front surface of the electrode box so that one side thereof is exposed through the opening 331 at the front side 33; and a plurality of light source elements 32 such as LEDs are mounted in the front of the upper part. Each of the electrode plate 31 and the light source elements 32 is connected to the electrical circuit of the control block built in the control box 20 through a signal line (ss).

Figure 4A:
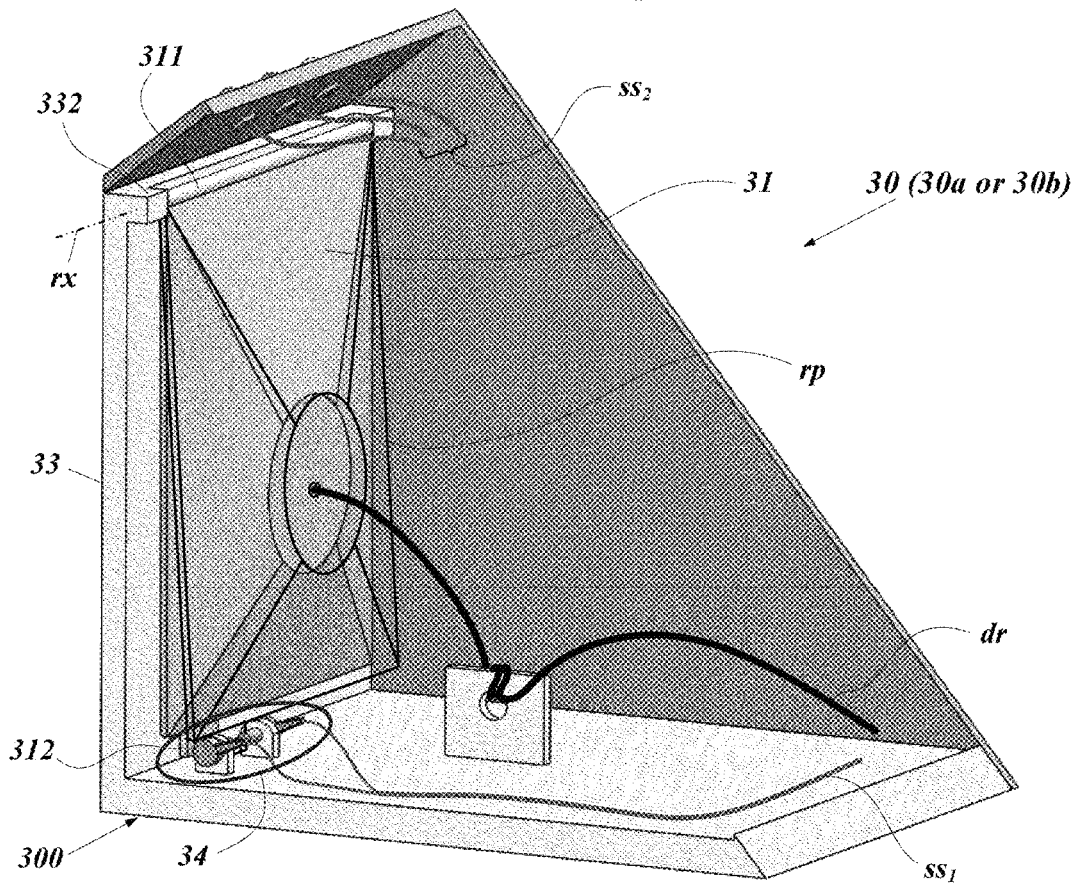
FIG. 4A is a view showing the inside of an electrode box constructed in accordance with an embodiment of the present invention by cutting it partially.

FIG. 4A is a partially cut-away perspective view of the housing 300 to show the inside of the electrode boxes 30a and 30b constructed according to an embodiment of the present invention.

In the illustrated electrode box 30, a pair of fixing protrusions 332 protrude inward respectively from both upper ends of the front side 33 in which the opening 331 is formed. Both ends of the shaft rod 311 formed at the top of the electrode plate 31 are respectively inserted into the holes of the both fixing protrusions 332, so that the electrode plate 31 is rotatable around the axis (rx) of the shaft rod 311. The electrode plate 31 is made of a thin conductor for weight reduction.

A plate-shaped contact piece 312 is provided in the vertical direction as an accessory member on one side of the lower end of the electrode plate 31. The contact piece 312 is coupled or attached to the electrode plate 31 with an insulating plate interposed therebetween. The insulation is to prevent the high voltage from flowing into the control block to be described later through the wire connected to the switch unit 34 when the high voltage for the withstand voltage test is applied to the electrode plate. The contact piece 312 comes into contact with the switch unit 34 provided on the bottom surface of the housing 300 when the lower part is pushed into the inner space (rp) as the electrode plate 31 rotates about the hinge axis (rx).

Figure 4B:
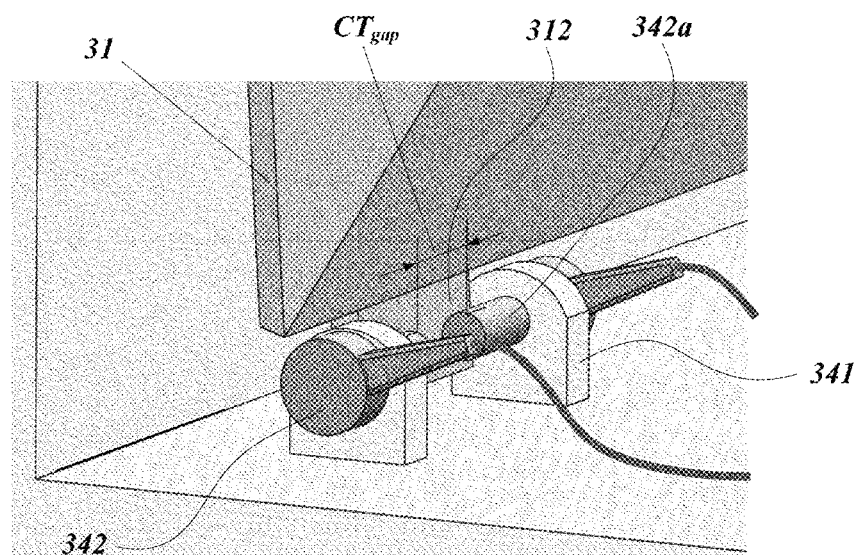
FIG. 4B shows the detailed structure of a switch unit, in the case where the contact piece of the electrode plate is in contact, which is laid inside the electrode box in accordance with an embodiment of the present invention.

FIG. 4B shows the detailed structure of the switch unit 34, in the case where the contact piece 312 coupled to the electrode plate 31 is in contact.

The switch unit 34 is composed of a pair of fixing protrusions 341 formed on the inner bottom of the housing 300, and a pair of conductive bolts 342, each cylindrical part of which is inserted into the through hole of the fixing protrusion 341. The ends of the cylindrical part of both bolts 342 are respectively fixed to the fixing protrusions 341 in a state in which they are spaced apart from each other. Both the cylindrical parts are used to detect the state that the electrode plate 31 is rotated inwardly.

When the electrode plate 31 is rotated inwardly, the contact piece 312 moves toward a gap $CT_{gap}$ between the ends of the cylindrical parts of both bolts 342. The contact piece 312 is configured to have a width wider than the gap $CT_{gap}$. Therefore, when the lower end of the electrode plate 31 is pushed inward as the electrode plate 31 is rotated around the shaft rod 311, the contact piece 312 comes into contact with the cylindrical parts of both bolts 342 at the same time, thereby electrically shorting both bolts 342.

Signal lines $ss_1$ are respectively connected to the heads of both bolts 342. These signal lines $ss_1$ are connected to the control block built in the control box 20 together with other signal lines $ss_2$ connected to the light source elements 32, respectively.

Figure 5A:
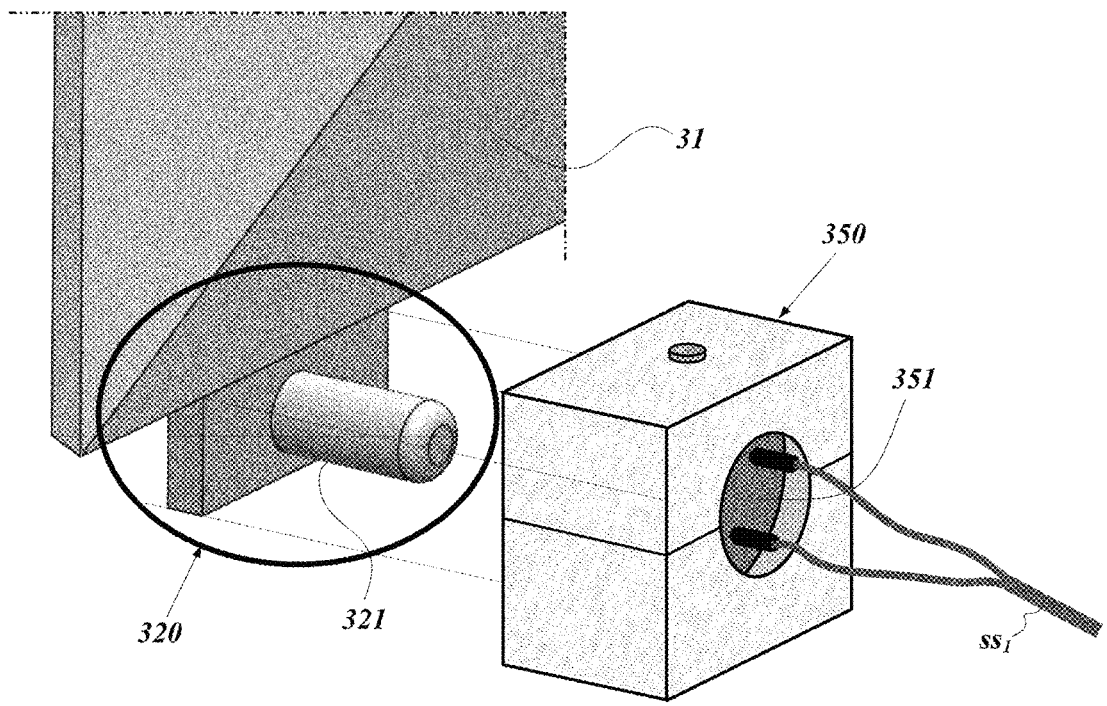
FIG. 5A is a perspective view showing components for detecting whether an electrode plate is rotated, which are configured according to another embodiment of the present invention.

In another embodiment according to the present invention, unlike the electrode box of the embodiment illustrated in FIGS. 4A and 4B, the electrode box may have a structure in which both signal lines $ss_1$ connected to the control block are connected to both ends of a push switch. FIG. 5A shows only the components to which both signal lines $ss_1$ are connected, with respect to the electrode box configured according to the present embodiment. In the present embodiment, a pushing element 320 is attached to the electrode plate 31 as an accessory and it includes a projection 321 of a predetermined height integrally formed or combined thereto.

A push switch 351 is coupled and fixed, in such a way that its button side faces the pushing element 320, to a fixture 350 installed on the path on the inner bottom of the housing through which the pushing element 320 passes when the electrode plate 31 rotates. Both ends of the signal lines $ss_1$ are respectively connected to both terminals of the push switch 351. In this embodiment, it is preferable to adopt a push switch having a weak repulsive force of its button.

In the electrode box structured as illustrated in FIG. 5A, a force applied to the electrode plate 31 presses the button of the push switch 351 through the projection 321 of the attached pushing element 320, thereby electrically shorting both of the signal lines $ss_1$. Accordingly, it is possible to detect through the push switch 351 whether the electrode plate 31 is in the inwardly-pushed state.

In the embodiment of the electrode box illustrated in FIG. 5A, since both signal lines $ss_1$ become short-circuited as long as a force is applied to the button of the push switch 351, there is no need for the pushing element 320 to be made of a conductive material, unlike the above-described embodiment using an electrical contact method.

Figure 5B:
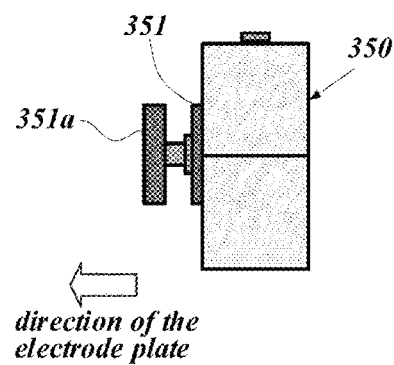
FIG. 5B is a side view showing another installation form of the components for detecting the rotation of the electrode plate, with respect to the embodiment of FIG. 5A.

In another embodiment according to the present invention, by installing the push switch 351 in the fixture 350 such that its button 351a protrudes more than an appropriate height from the surface of the fixture 350, as illustrated in FIG. 5B, it is also possible for the electrode plate itself to push the button 351a. In a case that the electrode box is configured in this way, the elements (a contact piece and a pushing element), which are attached or coupled to the electrode plate in order to electrically short-circuit both signal lines $ss_1$ in the above embodiments, become unnecessary.

In still other embodiments according to the present invention, the state that a force is applied to the electrode plate may be detected in a non-contact manner. One of these embodiments can be implemented by replacing the push switch 351 with a detection sensor, in the configuration of the embodiment illustrated in FIG. 5A, that is configured in a form in which a light emitting element and a light receiving element are disposed with an empty space between them. In this embodiment, for the withstand voltage test to be described in detail below, if the projection 321 of the pushing element 320 enters the empty space for detection that is secured between the light emitting and receiving elements of the detection sensor, and blocks the light from the light emitting element when a worker pushes the electrode plate with the strands of a electric wire, the light receiving state of the light receiving element is changed. This changed state is transmitted to the control block through the signal lines $ss_1$.

FIG. 6 shows the configuration of the control block 200, and also shows the mechanical driving unit 40 included in the present embodiment and a connection relationship therewith.

The control block 200 configured according to the present embodiment includes: a detection unit 220 for detecting a contact state of each switch unit 34 of the both electrode boxes 30; a divider 230 for distributing signals of signal lines (rs) that are tapped respectively to internal circuit lines of the WVT 10; and a control unit 210 that applies a Test Start Signal (TSS) to the WVT 10 depending on the signal detected by the detection unit 220 and drives the mechanical driving unit 40 depending on the test result signals $s_{GD}$ and $s_{NG}$ received from the WVT 10 through the divider 230.

The mechanical driving unit 40 is fixedly installed at a position where predetermined specific keys on the keyboard or keypad 60, which is input means of the computing device, can be stroked. In one embodiment according to the present invention, the mechanical driving unit 40 is, for such strokes, configured with a plurality of solenoids whose movement of a rod is controlled by an electrical force.

The number of solenoids equipped in the mechanical driving unit 40 corresponds to the type of keys to be input in order to record the history of the cable withstand voltage test in the computing device. For example, if inputs of the enter key and two direction keys on the keyboard are required, the mechanical driving unit 40 is installed with three solenoids configured such that each rod thereof is positioned just above those keys, as illustrated (411) in FIG. 6.

Hereinafter, a method of checking the withstand voltage of cables using the WVTD 100 according to an embodiment of the present invention will be described in detail.

A worker, first, selects the list 70 of the cables, which is illustrated in FIG. 7, to be tested from a computing device to be executed by a predetermined specific program that has functions of: selecting a current cell from cells constituting the list in response to inputs of direction keys or the like; and recording, on input of a specific key, the information type assigned to the selected cell, that is, information indicating the test result in a cell designated for the corresponding item on the list. In some embodiments, an information field 710 about additional information about the test, for example, the test date and time, is further included in the test list 70, and the specific program may further include a function of recording the date and time when the test result is recorded in the corresponding field 710.

In an embodiment according to the present invention, when the test is started in a state in which the test list 70 is loaded into the specific program, the cell of the first item to be tested in the column 720 corresponding to a predetermined field is designated as the current cell. This is only one example for the detailed description of the present invention, and this requirement may not be necessary depending on the manner in which the specific program is programmed. The same is true for inputs of specific keys and movements between cells on the test list 70, which will be described below as an example.

In a state in which the test list 70 illustrated in FIG. 7 is prepared, the method, in which the electrode box 30 illustrated in FIGS. 3 and 4 is used by a worker, of checking the withstand voltage of a cable to which the connector is coupled and the operation of the WVTD 100 configured for the method are as follows.

As in the prior art, a worker divides the wire strands and the grounding wire of a cable with both hands and puts them into each opening 331 of the pair of electrode boxes 30*a* and 30*b* so that each tip pushes the electrode plate 31.

Since the hinge axis (rx) is above the point where the force is applied by the tip of the wire strands and the electrode plate 31 is a lightweight thin film, as mentioned above, the electrode plate 31 is easily pushed into the inner space even if it is lightly pushed with the tip of the wire strands while the tip is in contact with the plate. Accordingly, the contact piece 312 coupled to the lower end of the electrode plate 31 is pushed backward and comes into contact with the pair of bolts 342.

The electrode plate 31 is configured to have a dome-like shape, or at least its central part is recessed based on the virtual surface formed by the edges to be partially shaped like a dome. Thus, all of the plurality of wire strands remain in contact with the electrode plate at the point where the applied force vanishes after sliding along the inclined surface of the electrode plate made by the dome-like shape according to their respective lengths if a worker maintains the pushing force even after some tips of the wire strands push the electrode plate to bring the contact piece 312 into contact with both bolts 342.

When the contact piece 312 comes into contact with both bolts 342 and the bolts 342 are electrically short-circuited, the detecting unit 220 detects that state. That state in which the electrode plate 31 is pushed inward by a worker's force that pushes the wire strands can be detected through the configurations according to various embodiments, as described above.

When a signal caused from a state in which the electrode plate is pushed inward is detected from each of the pair of electrode boxes 30*a* and 30*b*, that is, an electrical short circuit between both bolts 342 is detected, in the case of the embodiment according to FIGS. 4A and 4B, the detection unit 220 applies a signal notifying the completion of the test preparation to the control unit 210. When this signal is inputted, the control unit 210 applies the TSS through the control line $cs_1$ connected to the WVT 10.

Accordingly, the WVT 10 applies a preset high voltage to both output ports to which the test voltage driving line (dr) is connected. Since the test voltage driving line (dr) is also connected to the rear surface of both electrode plates 31 as shown in FIGS. 3 and 4, the high voltage driven by the WVT 10 is applied, via the conductive electrode plate 31, to both ends of the wire strands and the ground wire of the cable to be tested. In this state, if a current flows through the driving line (dr) more than the allowed leakage current, the WVT 10 determines that the result of the withstand voltage test is fail, and turns on an LED, provided on the front side, that indicates the failure.

Even if a current does not flow in the state in which a high voltage is applied, the WVT 10 maintains the high-voltage driving state for a preset duration, for example, 2 to 3 seconds, without immediately determining the withstanding voltage test as a pass. And, if no current flows in the driving line until the preset duration is over, the WVT 10 determines that the withstand voltage test has passed, and turns on the corresponding LED provided on the front, at the time when the duration is over.

In the WVTD 100, the signal lines (rs) tapped to the LED driving lines, inside the WVT 10, connected to the LEDs indicates the test result and the power on/off are connected to the divider 230, and the divider 230 distributes and connects each of the signal lines (rs) to each of the light source elements 32 of both electrode boxes 30*a* and 30*b*. Therefore, the result displayed by the WVT 10 after the withstand voltage test to be conducted as above is transmitted as it is ($ss_{2a}$, $ss_{2b}$) to the light source elements 32 installed on the top of the front of each electrode box 30*a*/30*b* through the divider 230, so that a light source element configured to indicate the transmitted result is turned on in each of the electrode boxes 30*a* and 30*b*.

When the TSS is applied, the WVT 10 displays a pass for the test only if no current flows for a preset time, as described above. By the way, the WVT 10 does not know whether the fact that no current flows in spite of driving a high voltage is due to normal insulation between the wire strands of a connector-coupled cable and the ground wire, namely, shield or due to separation of the wire strands or the ground wire, in contact with the electrode plate 31, from the electrode plate because of the carelessness of a worker. Therefore, even in the latter case, the test for the cable results in pass in the WVT. Such a test result is what is obtained in a state in which strict test condition, that is, the condition of maintaining a high-voltage applying state for a predesignated time, is not satisfied.

Thus, in one embodiment according to the present invention, the WVTD is configured to prevent obtaining the test result in the deficient state where the test condition is not satisfied due to the negligence or the like of a worker. In this embodiment, after applying the TSS to the WVT 10 when a test-ready signal is inputted from the detection unit 220, the control unit 210 checks whether the test-ready signal changes during a set time that is the same as or longer than the driving duration preset in the WVT 10 for the withstand voltage test.

If the test-ready signal changes within the set time, the control unit 210 immediately applies a reset signal through the control line $cs_1$ connected to the WVT 10. If the reset signal is inputted within the high-voltage driving duration for the withstand voltage test, the WVT 10 initializes the internal settings and circuits thereof without displaying a result of the present withstand voltage test.

Therefore, if the short-circuit state between the contact piece 312 and the switch unit 34 is released due to separation of the wire strands or the ground wire of the cable from the electrode plate 31, which is caused from a worker's mistake or carelessness during the test, the test does not proceed at that time.

In another embodiment according to the present invention, if the state changes after the test-ready signal is applied from the detection unit 220, the control unit 210 may apply a reset signal to the WVT 10 irrespective of whether that change is within the set time or after a lapse of that time. In this embodiment, it is possible to prevent the high-voltage driving power of the WVT 10 from being attenuated due to repeated withstand voltage tests on cables. In some of the WVTs, the driving current of the initially set requirement, for example, 10 mA, is not supplied to output ports as it gradually decreases while repeating the withstand voltage tests. In order to prevent the WVT from outputting a driving current that deviates from the test conditions in this way, a worker periodically presses the reset button provided on the WVT to initialize the WVT.

Therefore, as in the present embodiment, if a reset signal is applied to the WVT 10 unconditionally whenever the signal state of the test-ready signal from the detection unit 220 changes, that is, whenever the contact state is released after both the wire strands and the ground wire of the cable contact with the electrode plate 31, it becomes unnecessary for a worker to reset the WVT periodically during the cable withstand voltage tests.

In the present embodiment, if the reset signal of the control unit 210 is applied while the WVT 10 is conducting the withstand voltage test, that is, within the driving duration, the WVT 10 cancels the current test in progress, as described above. In the case that it is applied after the driving duration elapses, the test result has been displayed on the WVT, and transmitted to the control block 200 before it is applied.

On the other hand, when the WVT 10 completes the withstand voltage test and displays the result on the LED, a signal indicating the result is transmitted to the divider 230 as described above, and then the test result signals $s_{GD}$ and $s_{NG}$ distributed by the divider 230 are also transmitted to the control unit 210.

The control unit 210 applies a driving signal to the mechanical driving unit 40 in a manner determined according to the applied test result signals $s_{GD}$ and $s_{NG}$. An operation according to the input of the test result signal will be described in detail on the premise of the example of FIG. 7. The solenoid mounted just above the enter key must operate when a signal $s_{GD}$ indicating 'pass' among both test result signals $s_{GD}$ and $s_{NG}$ is inputted, so that the control unit 210 supplies a driving current for that solenoid to the mechanical drive unit 40.

Accordingly, the enter key is stroked, and a key input by this stroke is delivered to the aforementioned specific program being executed in the computing device. After this specific program, upon that key input, writes a code indicating pass in a current cell, and sets (p71) a predefined pass status modality for the neighboring cell assigned for a visual indication of pass/fail, it moves the current cell to the cell just below the current cell 721, that is, it moves the current test item to the next row on the cable list 70 that is corresponding to a cable to be tested next. According to an embodiment, during this process, information on the present date and time when the test result code is written may be recorded in a cell of a corresponding field.

If a signal $s_{NG}$ indicating 'fail' among both the test result signals $s_{GD}$ and $s_{NG}$ is inputted, the control unit 210 sequentially drives the solenoids equipped in the mechanical driving unit 40 to stroke keys corresponding to right movement, enter, and left movement in turn. Since the specific program is programmed to record information indicating a fail for an item when the enter key is inputted in a neighboring column other than the column 720 where the current cell is located on test start, it records, as illustrated in FIG. 7, a code indicating a fail in an information field, i.e., a cell where a test result is to be written, and sets (p72) a predefined fail status modality for the neighboring cell.

According to the method described above, a worker conducts withstand voltage tests on the connector-coupled cables using only both hands, and the test history for those cables is recorded in accordance with the pre-written cable list 70. In addition, even if the contact of the wire strands/ground wire of the cable with the electrode plate is temporarily released during the test due to the momentary carelessness, etc. of a worker, the test at that time is automatically canceled, so that the results of all tests on cables are obtained under the condition that the demanded test condition is satisfied.

Hereinafter, various embodiments of the present invention will be described.

Figure 8:
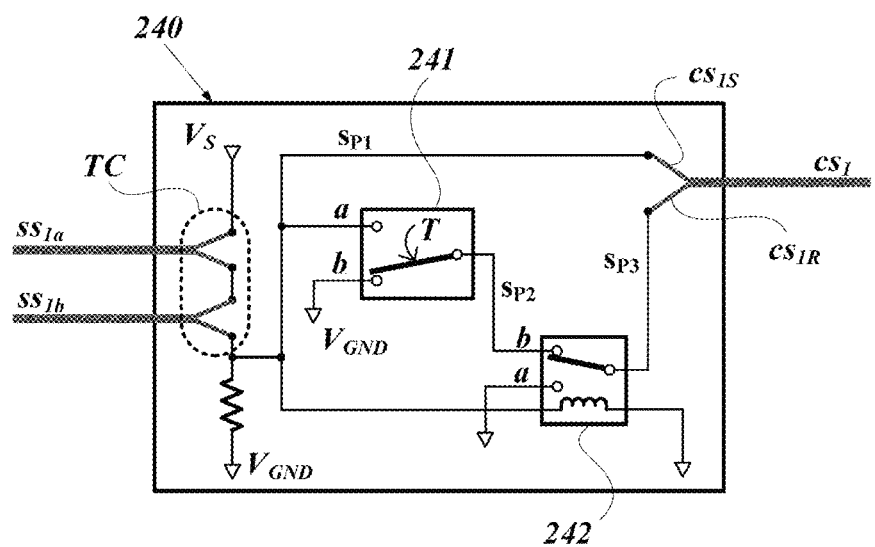
FIG. 8 is a block diagram of a detection unit configured, for the embodiment according to FIGS. 4A and 4B, according to an embodiment of the present invention to detect a short circuit of a switch unit and start a withstand voltage test.

One of various embodiments of the present invention may be the simplest implementation of the concept and technical idea of the present invention. In this embodiment, the control block 200 is composed of only a sensing unit without other components, and a signal output from the sensing unit may be directly applied as the TSS to the WVT 10. The sensing unit of this embodiment may be configured as illustrated in FIG. 8. Of course, the detection unit 220, whose operation has been described in the previous embodiment, may also be configured as illustrated in FIG. 8.

The illustrated sensing unit 240 is configured to include a timer 241 of maintaining a driving signal for a preset time when the driving signal is inputted, and a relay 242 of changing a contact state when a driving signal is inputted. In the sensing unit 240, both ends of a branch (TC), in which switch units 34 of the pair of electrode boxes 30 described above are connected in series, are connected to the power supply line $V_S$ and the power inlet point $S_{P1}$, respectively. And, one input terminal of the timer 241, a driving terminal of the relay 242, and a signal line $cs_{1S}$, a wire pertaining to the control line $cs_1$ connected to the WVT 10, through which the TSS is transmitted are commonly connected to the power inlet point $S_{P1}$.

By this circuit connection, when a worker pushes the electrode plate 31 with the wire strands and the ground wire of a cable under test and each switch unit 34 is short-circuited, as described above, the voltage of the power supply line $V_S$ is simultaneously applied to the aforementioned the one input terminal, the driving terminal, and the signal line $cs_{1S}$. The operation of the sensing unit 240 in this state will be described with reference to FIG. 9 that shows changes in the state of relevant signals over time.

When a worker pushes both electrode plates 31 to bring the contact piece 312 of each electrode box 30 into contact with the switch unit 34, the one input terminal of the timer 241, the driving terminal of the relay 242, and the TSS line $cs_{1S}$ of the control line $cs_{1S}$ connected to the WVT 10 become respectively the electric potential of the supply voltage level, that is, HIGH at a moment $t_S$ when both switch units 34 are in a short-circuit state. At this time, the output terminal of the timer 241 in the sensing unit 240 also becomes HIGH by the voltage applied to the input terminal a. This HIGH state is maintained only for a preset time TINT. The time TINT set in the timer 241 is not shorter than the driving duration $T_{REQ}$ preset for the WVT 10 to determine the test result after the start of the test.

When the TSS line $cs_{1S}$ becomes HIGH, the WVT 10 applies a preset high voltage to the driving line (dr) to test a withstand voltage of the connector-coupled cable.

Meanwhile, since both of the switch units 34 are short-circuited, power is also supplied to the driving terminal of the relay 242, and thus the path of the relay 242 is changed from terminal b to a so that the reference potential VGND, that is, LOW of the ground connected to the input terminal a is transmitted to the output terminal of the relay 242. Before power is supplied to the driving terminal, the output terminal of the relay 242 is connected to the input terminal b that is connected to the output terminal of the timer 241, so that the output terminal of the relay 242 is in LOW state since the output terminal of the timer 241 is connected to the input terminal b in LOW state.

The output terminal of the relay 242 is connected to a signal line $cs_{1R}$, one of the control lines $cs_1$ connected to the WVT 10, through which the reset signal is transmitted, and the reset signal inputted to the WVT 10 from this output terminal of the relay remains unchanged at LOW even after both the switch units 34 are short-circuited.

Figure 9:
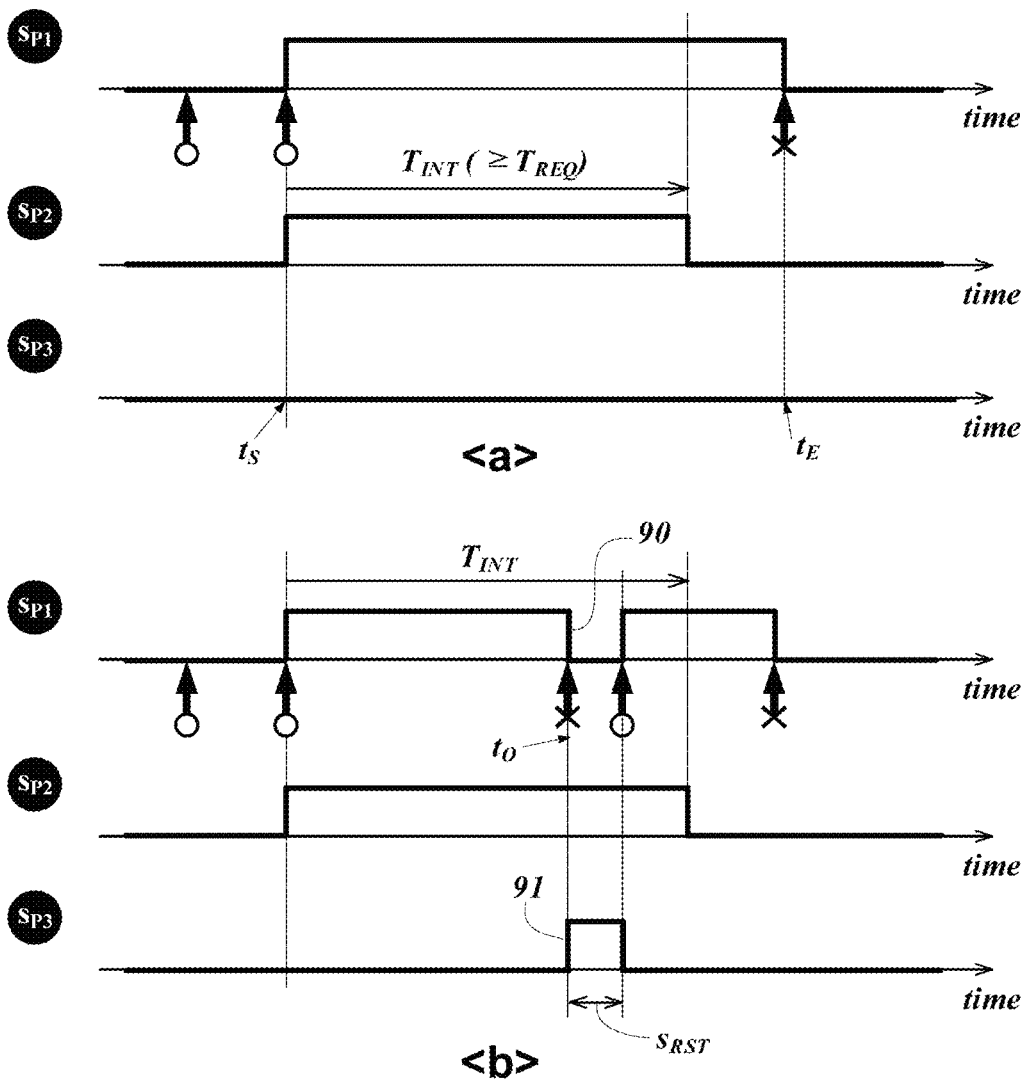
FIG. 9 is a signal state diagram for main points that shows the operating principle of the detection unit of FIG. 8.

Referring to <a> of FIG. 9, when the driving duration $T_{REQ}$ elapses while the short-circuit state of both the switch units 34 is maintained after the TSS is applied to the WVT 10, the test result is displayed. Then, a worker releases the force applied to the electrode plate 31 by the cable, and accordingly, the contact piece 312 of the electrode plate 31 returning to the original position is separated from the switch unit 34, which causes the switch units to be open. At this time point $t_E$, as the power supplied to the power inlet point $S_{P1}$ is cut off, the relay 242 is restored to the state in which the output terminal is connected to the input terminal b. The output terminal of timer 241 also becomes LOW, which is the initial state, as its connection is switched to the input terminal b when the set time TINT elapses. As a result, the test for one cable is normally ended.

If a worker fails to maintain contact of the contact piece 312 to the switch unit 34 for the driving duration $T_{REQ}$ of test requirement, and the contact is released on the way, the short-circuit state of the switch unit 34 is broken as the electrode plate 31 returns toward its original position as much as the separated. At this time point to, the power inlet point $S_{P1}$ transitions to LOW (90), as illustrated in <b> of FIG. 9.

When the power inlet point $S_{P1}$ becomes LOW, power driving the relay 242 is not supplied, and thus the path in the relay 242 is switched to b and is connected to the output terminal of the timer 241. At this time, since the driving duration $T_{REQ}$ has not elapsed and the output terminal of the timer 241 is in state of HIGH, the output terminal of the relay 242 transitions to HIGH (91). Since the output terminal of the relay 242 is connected to the reset signal line $cs_{1R}$ as described above, the reset signal line $cs_{1R}$ also transitions to active HIGH ($s_{RST}$). Accordingly, the WVT 10 cuts off the driving high voltage and stops the test progress. Of course, the test result is not displayed.

As described above, if a worker fails to maintain the contact state of the wire strands and the ground wire of the cable with the electrode plate 31 for the driving duration $T_{REQ}$, and thus either temporarily does not contact with the electrode plate, the reset signal is applied to the WVT 10 at that moment, so that the WVT 10 stops the current test and no signal is generated for displaying the test result. In the embodiment in which the control unit 210 and the mechanical driving unit 40 are provided, since the signals $s_{GD}$ and $s_{NG}$ indicating the test result are not received, the control unit 210 does not apply any driving signal to the mechanical driving unit 40.

Therefore, no information on the current test item is recorded in the test list 70, unlike described above. After the time TINT set in the timer 241 has elapsed and the timer 241 is changed back to the initial state, a worker proceeds with the test for the current cable again.

In an embodiment according to the present invention in which the control unit 210 is included, the circuitry of the control unit 210 may be configured to receive a signal from the output terminal of the relay 242 of the detection unit 220 as an input, and to apply the inputted signal to the reset signal line $cs_{1R}$. In this embodiment, when the control unit 210 applies HIGH to the reset signal line $cs_{1R}$, it drives a light source element indicating a test error that is provided as one of the light source elements 32, thereby visually informing a worker that the current test is stopped abnormally.

In an embodiment according to the present invention, the control block 200 may be configured to further include an audible sound generating element such as a buzzer. In this embodiment, when the control unit 210 applies the reset signal to the WVT 10 because the short circuit state of the switch unit 34 is not maintained for the driving duration $T_{REQ}$, it drives the audible sound generating element to produce a warning sound. In addition, even when the short-circuit state of the switch unit 34 is maintained for the driving duration $T_{REQ}$ and the test is normally completed, the control unit 210 may drive the audible sound generating element to produce a particular sound indicating normal completion of the test.

In the description of the above-described embodiments, it is assumed that the WVT 10 performs the corresponding operations when each of the TSS and the reset signal is HIGH. However, this is only an example for detailed descriptions, and the WVT may receive LOW as an active signal with respect to those signals. For this type of WVT, the circuitry of the detection unit 220 is naturally configured to output an active signal corresponding thereto.

The operation of the WVTD 100 described so far can be applied as it is to an embodiment in which an electrode box is equipped with an electrode plate formed in a different structure. Hereinafter, the structure of this embodiment will be mainly described.

Figure 10:
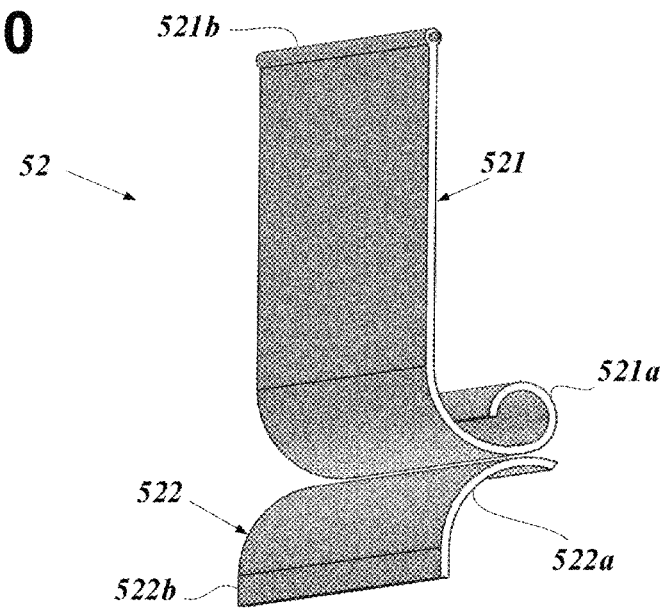
FIG. 10 is a perspective view showing the structure of an electrode plate according to another embodiment of the present invention.
Figure 11:
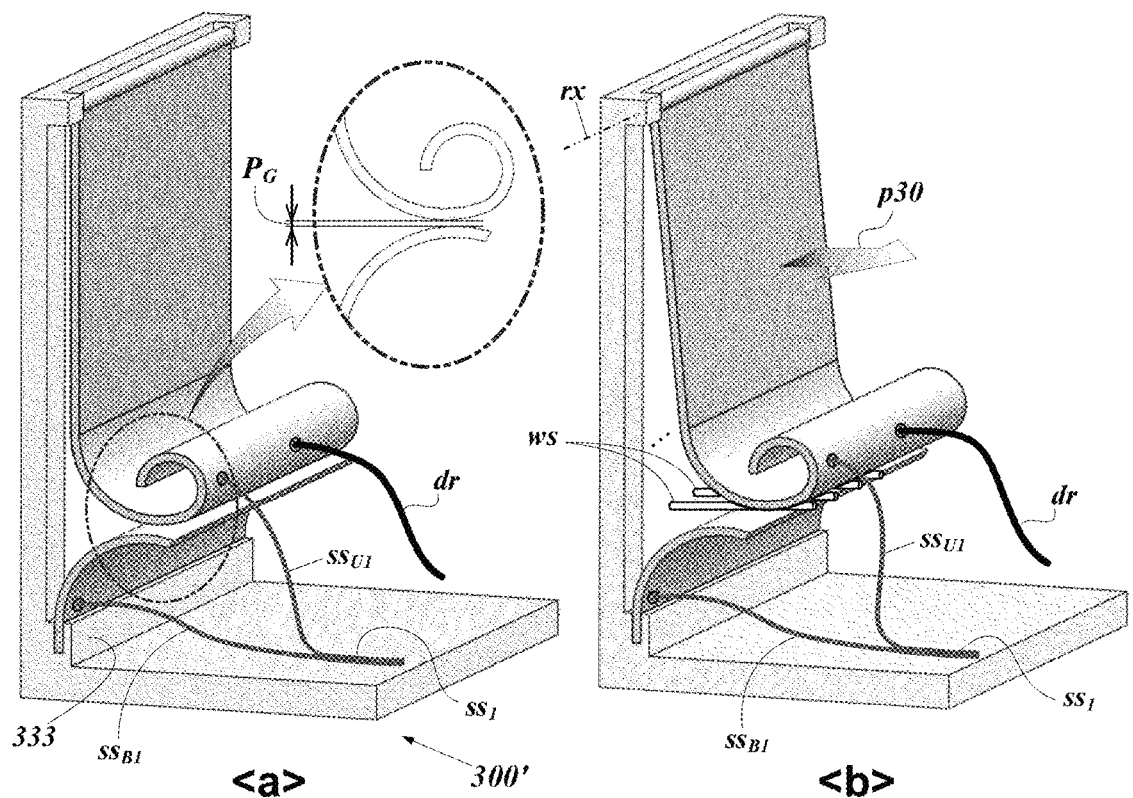
FIG. 11 is a view showing the operation principle of the electrode plate in the electrode box in which the electrode plate of the embodiment of FIG. 10 is installed.

FIG. 10 is a perspective view showing the structure of the electrode plate 52 configured according to an embodiment of the present invention, and FIG. 11 illustrates only a part of the electrode box that is equipped with the electrode plate 52 structured according to this embodiment.

The electrode plate 52 of this embodiment is composed of a movable plate 521 and a static plate 522, which are made of a conductive material, separated from each other. The movable plate 521 has an axial rod 521b formed at its upper end similarly to the electrode plate 31 of the above-described embodiment. In addition, the adjacent parts of the movable plate 521 and the static plate 522 are configured in a curved shape (521a, 522a) so that the front side forms a smooth curved surface when mounted on the housing.

The curved part 521a of the movable plate 521 may be embodied in a spirally rolled shape one or more times to have an appropriate weight. Alternatively, it may be curved to form a pipe into which a rod of suitable weight can be inserted.

As illustrated in FIG. 11, the movable plate 521 is mounted on the housing 300' in the same manner as the electrode plate 31 of the above-described embodiment, and it rotates around the upper axis (rx) when a pushing force is applied from the front of the electrode box. In the case of the static plate 522, the flat part 522b is put and fixed in the upper groove of the corner stage 333 formed along the front bottom edge of the housing 300'. It may be fixed therein using a separate fastening means such as screws.

The housing 300' is configured to be opened to the front or to have at least an opening corresponding to the front portion facing the curved parts 521a and 522b of the mounted electrode plate 52.

The movable plate 521 and the static plate 522 are configured such that their curved parts 521a and 522a are vertically spaced apart by a predetermined gap $P_G$, when they are mounted on the housing 300'. This gap $P_G$ should be shorter than the diameter of a wire strand of the cable to be tested for withstand voltage.

Figure 12:
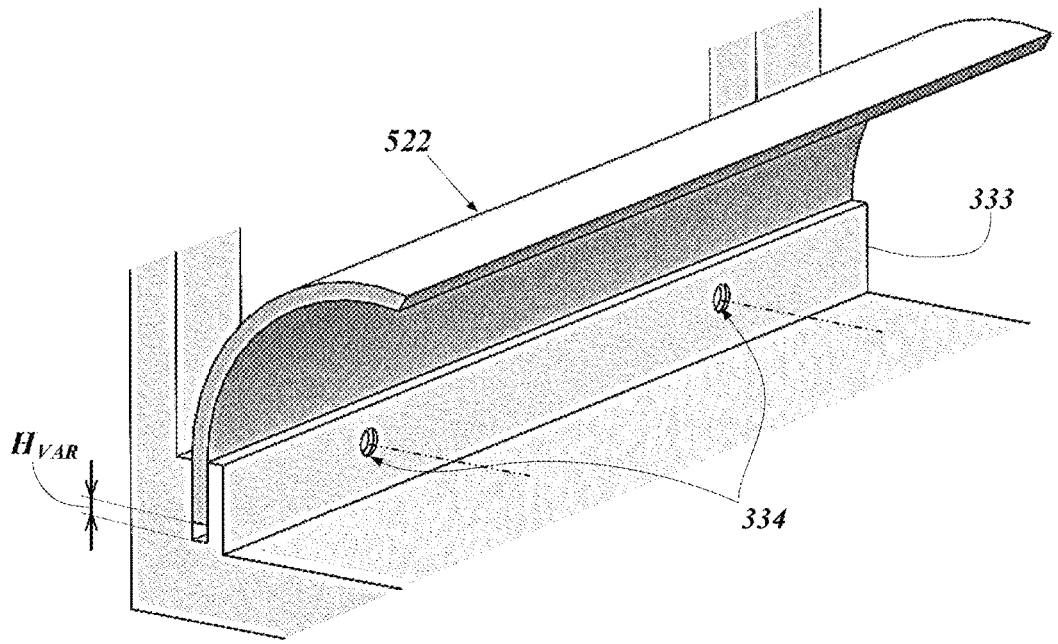
FIG. 12 shows an example of an electrode box configured to adjust the gap between the divided electrode plates, according to an embodiment of the present invention.

In one embodiment according to the present invention, the electrode box may be configured such that the gap $P_G$ can be adjusted as needed. FIG. 12 partially illustrates the housing of the electrode box structured according to the present embodiment. A plurality of through holes 334, each of which a fastening bolt capable of fixing the static plate 522 inserted in the groove by pressing the static plate 522 can be inserted into, are formed on one surface of the corner stage 333.

Therefore, in a state (HVAR) in which the upper curved part 522a of the static plate 522 is appropriately spaced from the bottom of the groove so as to form a desired gap with the lower curved part 521a of the movable plate 521, each of the bolts inserted into the through hole 334 is tightened to strongly contact to the static plate 522. In this way, the gap between the movable and static plates is adapted to the cable to be tested.

The driving line (dr) through which the WVT 10 drives a high voltage is connected to the movable plate 521 of the electrode plate 52, and a pair of signal lines $ss_{U1}$ and $ss_{B1}$ are respectively connected to the movable plate 521 and the static plate 522. The pair of signal lines $ss_{U1}$ and $ss_{B1}$ are connected to the circuitry of a detection unit according to the present embodiment, which will be described later, such that their electrical terminations, that is, the movable plate 521 and the static plate 522 act as both terminals of a switch.

In another embodiment of the present invention, the driving line (dr) through which the WVT 10 drives a high voltage may be connected to the static plate 522.

The electrode box in which the electrode plate 52 is mounted to the housing 300' as shown in <a> of FIG. 11 is used in the manner illustrates in <b> of FIG. 11 in the withstand voltage test for a cable.

When conducting a withstand voltage test on a cable, a worker inserts, at the front of each electrode box, the wire strands and the ground wire of the cable into a canal that is formed by smooth slopes of both curved parts 521a and 522a of the movable plate 521 and the static plate 522 of the electrode plate 52. In this process, some of the wire strands collide with the inclined surface adjacent to the gap and are then guided toward the gap by the slope of the surface. It is preferable that a worker applies a weak downward force to the wire strands or the ground wire to be inserted into the gap in a state of close contact with the upper part of the static plate 522 fixed to the housing 300'.

The ends of the wire strands and the ends of the ground wire approach the gap $P_G$ between both plates, and a worker's pushing force continues after that. Then, the non-fixed movable plate 521 is pushed toward the inside of the electrode box (p30) with its upper end as a hinge axis (rx) since the gap $P_G$ between the movable plate 521 and the static plate 522 is shorter than the diameter of the wire strand.

A worker stops the insertion operation when the movable plate 521 is no longer pushed inward as all of the tips of the wire strands (ws) and the tip of the ground wire pass through the gap $P_G$. At this time, the movable plate 521 and the static plate 522 are electrically connected by the wire strands (ws) or the ground wire sandwiched therebetween. Of course, this electrical connection state may be made at a time earlier than that when a part of the wire strands or the ground wire makes simultaneous contact with both curved parts 521a and 522a while filling the spacing between the movable plate 521 and the static plate 522.

In a state in which the wire strands (or ground wire) have passed through the gap $P_G$, they are pressed by the appropriate weight of the movable plate 521, so that the movable plate 521, the wire strands (or ground wire), and the static plate 522 are maintained in contact with each other.

In another embodiment according to the present invention, an elastic member for applying a force to restore the movable plate 521 to the front may be provided on the inner side of the movable plate 521. The elastic force of this elastic member is preferably such that the movable plate 521 can be pushed without bending a plurality of wire strands (or grounding wire) when the movable plate 521 is pushed with those wire strands (or the grounding wire).

Figure 13:
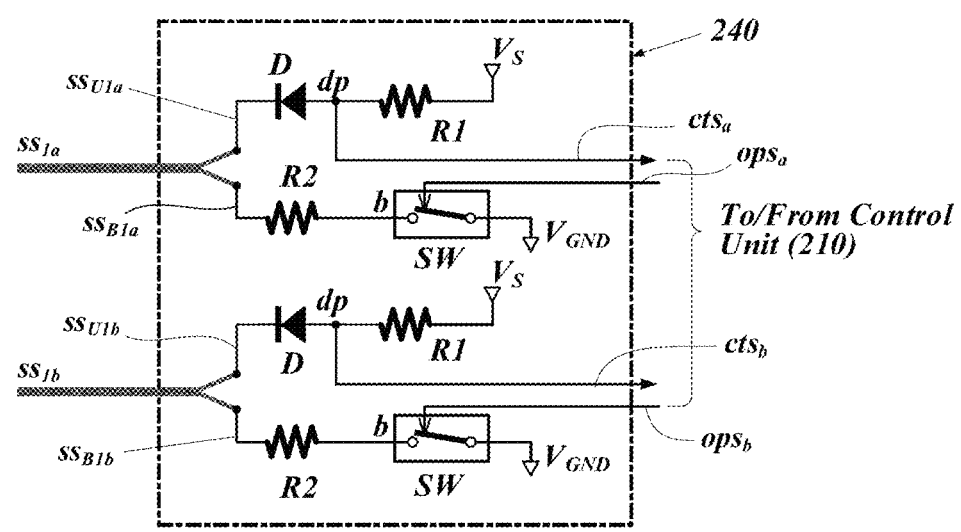
FIG. 13 is a circuit diagram according to an embodiment of the present invention, for detecting a signal, which is required to determine the start time of the withstand voltage test, from the electrode box in which the electrode plate illustrated in FIG. 10 is equipped.

The electrically-connected state between the movable plate 521 and the static plate 522 via the wire strands (or ground wire) is transmitted to the detection unit 260, which may be configured as illustrated in FIG. 13, through the signal lines $ss_{U1}$ and $ss_{B1}$ connected to each plate. Hereinafter, the operation of the detection unit 260 will be described in detail. The detection unit 260 may be included in the control block 200, whose configuration is exemplified in FIG. 6, instead of the above-explained detection unit 220.

In the detection unit 260 of FIG. 13, the signal lines $ss_{U1x}$ and $SS_{B1x}$ (x=a, b) are connected to the movable plate 521 and the static plate 522 of each electrode box through a pair of wires $ss_{1a}$ and $ss_{1b}$, and whether the movable plate 521 and the static plate 522 are electrically shorted to each other is detected from the electrical state of each of signal line pairs $ss_{U1x}$ and $ss_{B1x}$ (x=a, b). Since this detection process is performed in the same way by a pair of detection blocks configured in the same circuit for a pair of electrode boxes, the detecting operation of the detection block for only one electrode box will be described.

The detection block for detecting the electrically-connected state between the movable plate 521 and the static plate 522 of the electrode box comprises: a first resistor R1 and a diode D, which is referred to as a 'source branch' hereinafter, connected in series between the power supply terminal and the signal line $ss_{U1a}$ connected to the movable plate 521; and a second resistor R2 and a switch SW, which is referred to as a 'drain branch' hereinafter, connected in series between the ground and the signal line $ss_{B1a}$ connected to the static plate 522. And, a detecting line $cts_a$ is connected to the node (dp) between the first resistor R1 and the diode D, and is connected to the input terminal of the control unit 210 in the control block 200 of FIG. 6.

The switch SW may be a relay whose an input terminal is opened or closed depending on whether a driving current is supplied, and it is preferable that both terminals of the switch SW are electrically connected when the driving current is not applied, and they are electrically disconnected when the driving current is applied.

In the state <a> of FIG. 11 in which the wire strands (ws) are not inserted between the movable plate 521 and the static plate 522, both signal lines $ss_{U1a}$ and $ss_{B1a}$ are disconnected from each other. Accordingly, no current flows in the source branch in which the first resistor R1 and the diode D are connected in series, and the same potential $V_S$ as the power supply terminal is maintained at the node (dp).

However, when both plates are electrically shorted by the wire strands (ws) as a worker inserts the wire strands (ws) into the gap between the movable plate 521 and the static plate 522, as described above, a closed circuit is made between the power supply terminal and the ground by the switch SW whose both terminals are connected. Accordingly, the potential of the node (dp) changes while the current flows along the path of the source branch and the drain branch.

Then, the potential of the node (dp) is changed to R2/(R1+R2)·VS. That is, a voltage drop occurs at the node (dp). If the first resistor R1 and the second resistor R2 of the same resistance value (R1=R2) are applied in the embodiment, the potential of the node (dp) drops to ½ of the potential before the short circuit between the movable plate 521 and the static plate 522 when they are electrically short-circuited through the wire strands.

The control unit 210 of FIG. 6 detects such a potential change on the detecting line $cts_a$ connected to the node (dp), and then it determines that wire strands have been inserted between the movable plate 521 and the static plate 522.

When the voltage drops by greater than a predetermined magnitude on both the detecting lines $cts_a$ and $cts_b$ connected to the electrode plate 52, the control unit 210, at that time, applies a driving signal for opening the switch SW through the connected control line $ops_a$. When the driving signal is inputted, both terminals of the switch SW becomes open, thereby blocking the current path.

Following the applying the opening signal to the switch SW, the control unit 210 applies the TSS to the WVT 10 as described above. Accordingly, the WVT 10 tests the withstand voltage as described above while supplying a high voltage through the driving line (dr).

In an embodiment according to the present invention, when a state in which a voltage drop of the predetermined magnitude or greater occurs on both the detecting lines $cts_a$ and $cts_b$ is maintained for a predesignated interval (e.g., several hundred msec), the TSS may be applied to WVT 10.

While the WVT 10 drives a high voltage for the test, the high voltage is applied to one of both the plates, however, since a reverse voltage is applied to the diode D in the source branch and the drain branch is broken by the switch SW in the detection unit 260, no current flows into the detection unit despite the high voltage applied for the test. That is, the detection unit 260 configured as illustrated in FIG. 13 has no effect on the withstand voltage test for cables.

Figure 14:
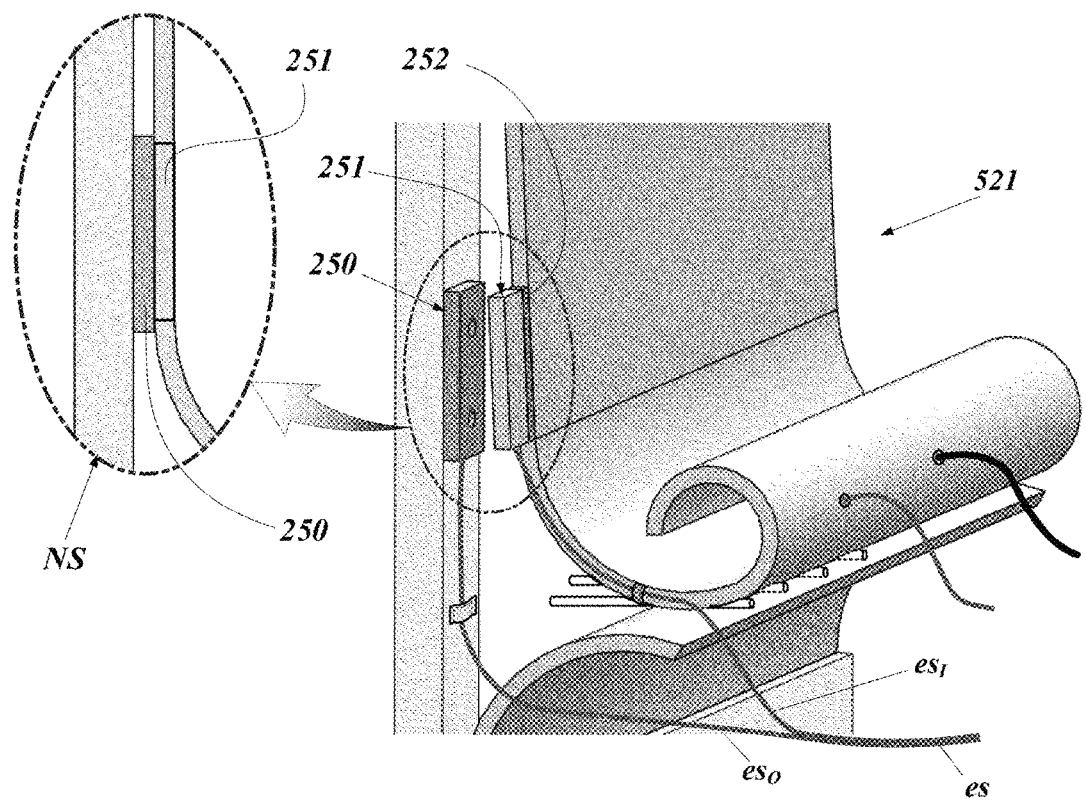
FIG. 14 is a view showing a part of an electrode box configured by assembling the divided electrode plates so as to confirm continuation of the testing state for a set time, according to another embodiment of the present invention.

In a case that the electrode plate is configured in the form illustrated in FIGS. 10 and 11 and applied to the WVTD, if the contacted state of the wire strands and the ground wire of a cable with the electrode plate is not maintained during the driving duration set for the test, the test of the WVT 10 may be reset, as in the above embodiment. In an embodiment for this, the electrode box is configured to further include a contact sensor. This contact sensor, as illustrated in FIG. 14, comprises a movable contact piece 251 of a conductive material attached to one side of the movable plate 521, and a static contact piece 250 made of a conductive material, which is fixed to a position, which faces on the position of the movable contact piece 251, on the inner surface of the front support of the housing. The movable contact piece 251 rotates along with the rotation of the movable plate 521 since it is fixedly attached to the movable plate 521 with the insulator 252 interposed therebetween.

Figure 15:
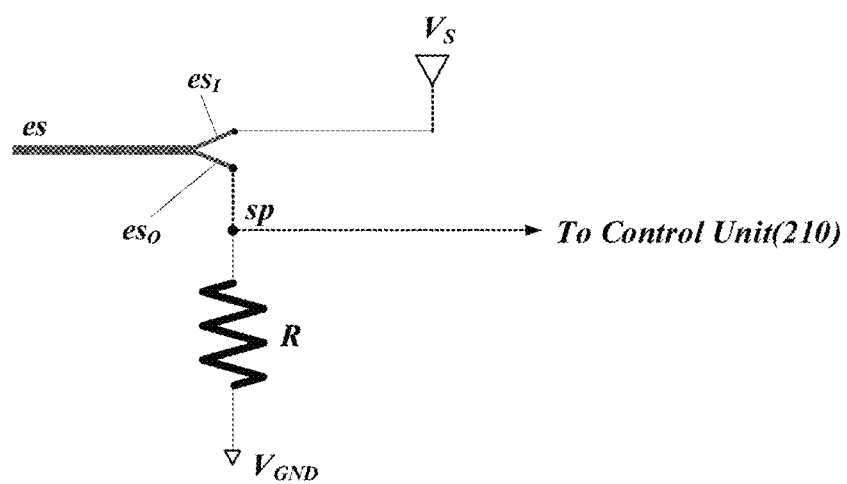
FIG. 15 is a diagram showing an example of a contact sensing circuit implemented for each electrode box in order to confirm that the testing state is maintained in the embodiment of FIG. 14.

In addition, signal lines $es_I$ and $es_O$ for sensing contact are respectively connected to the movable contact piece 251 and the static contact piece 250 and are respectively connected to an electrical branch of the sensing circuit configured as illustrated in FIG. 15. This sensing circuit may be integrated into either the detection unit 240 of FIG. 13, or the control unit 210.

In a state in which the wire strands or the ground wire is not inserted between the movable plate 521 and the static plate 522, that is, no force is applied to the movable plate 521, the movable contact piece 251 and the static contact piece 250 maintain contact with each other (NS), as illustrated in FIG. 14. Therefore, a closed circuit is made in the sensing circuit of FIG. 15, so that a current flows and the sensing node (sp) is in HIGH state.

When a worker pushes the wire strands and the ground wire between the gaps of the electrode plates of both electrode boxes, respectively, as described above for the withstand voltage test on a cable, the movable contact piece 521 is pushed inward and the electrical short circuit between the movable contact piece 251 and the static contact piece 250 is broken, which means that the branch of the sensing circuit of FIG. 15 is cut off. At this time, the current flow is stopped and the sensing node (sp) is transited to the potential, that is, LOW of ground to which the resistor is connected.

Thus, after making the switch SW of the detection unit 260 open and applying the TSS to the WVT 10, the control unit 210 continuously checks the state of the sensing node (sp) for at least a time set equal to or longer than the driving duration. If both or either of the sensing nodes (sp) is changed to HIGH during the checking, at least one of the wire strands and the ground wire is separated from the gap $P_G$ of the electrode plate 52, so that the control unit 210 applies the reset signal to the WVT 10 as described above.

In the embodiment of the present invention described with reference to FIGS. 10 to 13, a conductor must be inserted between the movable plate 521 and the static plate 522 separated from each other in order to proceed with the withstand voltage test. Therefore, it is not possible to sabotage such as falsely passing the withstand voltage test for a cable by pushing the electrode plate 31 with an object other than a conductor to short-circuit the switch unit 34, which a malicious worker might do in the event of the withstand voltage test for a cable using the embodiment to which the electrode plate of the structure illustrated in FIGS. 4A and 4B is applied.

Operations such as display of test results and recording of test history in a computing device by controlling the mechanical driving unit 40, which are not described with respect to the embodiment of the present invention illustrated in FIGS. 10 to 13, are performed in the same manner as previously described with respect to the embodiment in which the electrode plate having the structure illustrated in FIGS. 4A and 4B is equipped.

Unless the various embodiments for the WVTD described so far are incompatible with each other, the explained embodiments can be properly chosen in various ways and then combined to embody the concept and idea of the present invention.

The embodiments of the present invention described above have been introduced for the purpose of illustration; therefore, it should be understood by those skilled in the art that modification, change, substitution, or addition to the embodiments is possible without departing from the technical principles and scope of the present invention defined by the appended claims.

What is claimed is:

1. A device for checking withstand voltage of a cable, comprising:
   a pair of electrode boxes; and
   a control block configured to apply a start signal to a test instrument, which drives output ports thereof with a preset voltage, in accordance with an electrical state detected in each of the pair of electrode boxes,
   wherein each of the pair of electrode boxes comprises:
      a housing configured such that at least a part of a front side thereof is open;
      a conductive electrode plate mounted on an inner front side of the housing in such a way that it is rotatable around its top end; and
      a switch unit, mounted inside the housing with a predetermined gap from the electrode plate, configured to detect a state in which the electrode plate is rotated while a lower part of the electrode plate is pushed inward,
   wherein the electrical state is an electrical state between both terminals of the switch unit, and the electrode plates of the pair of electrode boxes are electrically connected to the output ports respectively, and
   wherein the switch unit is configured such that the electrical state between both terminals is changed by a force applied by the electrode plate or an accessory member coupled to the electrode plate.

2. The device of claim 1, wherein the control block is further configured to apply a reset signal to the test instrument if the electrical state at a time of applying the start signal is not maintained until a predetermined time elapses from the time of applying the start signal.

3. The device of claim 1, wherein at least a part of region on the electrode plate is configured to have an inclined surface formed according to a shape that is more recessed toward inside of the housing as a part thereof is closer to center.

4. The device of claim 1, wherein the accessory member to face the switch unit when it rotates together with the electrode plate is coupled to the electrode plate.

5. The device of claim 4, wherein the switch unit is configured such that the electrical state between both terminals is changed by physical contact with the accessory member or by non-contact entrance of the accessory member into a predetermined detection space.

6. The device of claim 1, wherein the control block is connected to a specific line, through which the test instrument transmits a signal for displaying a test result according to driving the output ports to the preset voltage, and receives a signal carried on the specific line.

7. The device of claim 6, wherein the control block is configured to control lighting of a plurality of light source elements, which are fixedly installed on one surface of the housing, so that they are turned on differentially depending on a signal carried on the specific line.

8. The device of claim 6, further comprising a mechanical driving unit, installed above input means of a computing device, capable of individually stroking a plurality of keys provided on the input means,
   wherein the control block is configured to apply a driving signal to the mechanical driving unit so that it strokes a different key depending on a signal carried on the specific line.

9. The device of claim 1, wherein the control block is configured to apply the start signal at a time when the electrical states detected respectively from the pair of electrode boxes become the same.

10. The device of claim 1, wherein the control block is further configured to apply a reset signal to the test instrument when a predetermined time elapses from a time of applying the start signal.

11. A device for checking withstand voltage of a cable, comprising:
    a pair of electrode boxes; and
    a control block configured to apply a driving start signal to a test instrument, which drives output ports thereof with a preset voltage, in accordance with an electrical state detected in each of the pair of electrode boxes,
    wherein each of the pair of electrode boxes comprises:
       a housing configured such that at least a part of a front side thereof is open;
       a conductive movable plate mounted on an inner front side of the housing in such a way that it is rotatable around its top end; and
       a static plate fixed to an inner front side of the housing so as to be vertically coplanar with the movable plate by leaving a gap with a lower end of the movable plate,
    wherein the electrical state is either of electrical disconnection and short circuit between the movable plate and the static plate according to whether a conductive object is inserted into the gap, and the movable plates or the static plates of the pair of electrode boxes are electrically connected to the output ports respectively, and
    wherein a lower part of the movable plate and an upper part of the static plate bend into the housing to form a curved surface, respectively.

12. The device of claim 11, further comprising:
    a first contact piece fixed to one side of the movable plate in an electrically insulating manner from the movable plate; and
    a second contact piece provided at a spot, on inner surface of a front support of the housing, that faces the first contact piece, and
    wherein signal lines for detecting a contact between the first and the second contact pieces are respectively connected to both contact pieces, and each of the signal lines is connected to a detecting circuit included in the control block.

13. The device of claim 12, wherein the control block is further configured to apply a reset signal to the test instrument if non-contact state between both contact pieces detected from the signal lines is not maintained until a predetermined time elapses from a time of applying the start signal.

14. The device of claim 11, wherein the control block comprises:
- a detecting circuit configured to apply a voltage to both terminals, which are the movable plate and the static plate respectively, in order to detect the electrical state; and
- a control unit configured to cut an electrical connection within the detection circuit so that no current flows therein when a signal corresponding to a short circuit between the movable plate and the static plate is detected from the detection circuit.

15. The device of claim 11, wherein the housing is structured such that height of the static plate from bottom of the housing adjustable.

16. The device of claim 11, wherein the control block is connected to a specific line, through which the test instrument transmits a signal for displaying a test result according to driving the output ports to the preset voltage, and receives a signal carried on the specific line.

17. The device of claim 11, wherein the control block is configured to apply the start signal at a time when the electrical states detected respectively from the pair of electrode boxes become the same.

18. The device of claim 11, wherein the control block is further configured to apply a reset signal to the test instrument when a predetermined time elapses from a time of applying the start signal.

* * * * *